United States Patent [19]

Kawai et al.

[11] Patent Number: 4,796,224
[45] Date of Patent: Jan. 3, 1989

[54] LAYOUT FOR STABLE HIGH SPEED SEMICONDUCTOR MEMORY DEVICE

[75] Inventors: Hideki Kawai, Nara; Masaru Fujii; Kiyoto Ohta, both of Takatsuki; Yoshikazu Maeyama, Kyoto, all of Japan

[73] Assignee: Matsushita Electronics Corporation, Kadoma, Japan

[21] Appl. No.: 15,349

[22] Filed: Feb. 17, 1987

[30] Foreign Application Priority Data

Feb. 18, 1986 [JP] Japan .................................. 61-34679

[51] Int. Cl.$^4$ ................................................ G11C 5/02
[52] U.S. Cl. ........................................ 365/51; 365/63; 365/230; 365/189
[58] Field of Search ................. 365/61, 62, 63, 64, 365/51, 72, 221, 219, 239, 240, 78, 189, 230

[56] References Cited

U.S. PATENT DOCUMENTS

| | | | |
|---|---|---|---|
| 4,586,171 | 4/1986 | Fujishima | 365/63 |
| 4,648,077 | 3/1987 | Pinkham et al. | 365/240 X |
| 4,660,174 | 4/1987 | Takemae et al. | 365/63 X |
| 4,695,978 | 9/1987 | Itakura | 365/51 X |
| 4,700,328 | 10/1987 | Burghard | 365/51 X |
| 4,701,884 | 10/1987 | Aoki et al. | 365/189 X |
| 4,701,885 | 10/1987 | McElroy | 365/230 |

FOREIGN PATENT DOCUMENTS

| | | | |
|---|---|---|---|
| 53-32635 | 3/1978 | Japan | 365/63 |
| 53-39022 | 4/1978 | Japan | 365/63 |

Primary Examiner—Stuart N. Hecker
Assistant Examiner—Alfonso Garcia
Attorney, Agent, or Firm—Wenderoth, Lind and Ponack

[57] ABSTRACT

In a semiconductor memory device, a memory cell array is separated into at least two portions on a substrate, and a serial memory element, such as a shift register, and control signal lines are collectively disposed between the two memory cell array portions, and by this arrangement, the length of the control signal lines and data lines can be minimized so that the stray or parasitic capacitance is reduced, and a higher speed and stable operation of the device is thereby realized.

2 Claims, 5 Drawing Sheets

LAYOUT FOR STABLE HIGH SPEED SEMICONDUCTOR MEMORY DEVICE

BACKGROUND OF THE INVENTION

This invention relates to a new semiconductor memory device, and more specifically, to a new circuit element arrangement of a semiconductor memory device.

FIGS. 4 and 5 show examples of the layout of circuit elements in conventional semiconductor memory devices. In FIG. 4, single memory cell array 2 is disposed in the center portion of the semiconductor substrate 1, and two shift registers 4,4, used as serial memories, are contiguously arranged on both sides of said memory cell array 2. A control signal from a control signal generator 62 is transmitted to said shift registers 4,4 through control signal lines 52,52. Input or output data is transmitted between said shift registers 4,4 and an input/output (I/O) circuit 64. In FIG. 5, a memory cell array is separated into two blocks 2,2 on the substrate 1. A single shift register 4 is disposed on one side of said memory cell arrays 2,2 and a plurality of data lines 65 connect said memory cell arrays 2,2 and to said shift register 4. A control signal from the control signal generator 62 is transmitted to said shift register 4 through the control signal line 52. Input or output data is transmitted between said shift register 4 and the I/O circuit 64.

The basic operation of the semiconductor memory devices of FIGS. 4 and 5 is as follows.

In a read-out mode, multi-bit data read out from the memory cell array(s) 2 is temporarily stored in the shift register(s) 4, and then the data is transmitted to the I/O terminals (not shown) of the device through the I/O circuit 64. Such an operation is controlled by the control signal from the control signal generator 62. In a write mode, the data from the I/O circuit 64 is temporarily stored in the shift register(s) 4, and then the data is written in the memory cell array(s) 2. Such an operation is also controlled by the control signal from the control signal generator 62.

However, in the layout of the circuit elements shown in FIG. 4, since the length of the control signal lines 52,52 is quite long, the stray capacitance of said lines tends to increase, and therefore, the delay of a signal transmitted along said lines 52,52 tends to become long. As a result, the input/output operations and the data transfer operations of the shift registers 4,4 become slower, the high speed operation of the memory device is sacrificed. In view of the recent tendency for the memory capacity to become large, the size of the substrate of semiconductor memory device has tended to become larger. In such a case, the above-mentioned problem becomes quite serious. On the other hand, in case of the layout shown in FIG. 5, the length of the control signal line 52 is shorter, and therefore, so far as the shift register operation is concerned, there are few factors which make its operation speed slow. However, the length of the data lines 65 which connect the memory cell arrays 2,2 and the shift register 4 have to become longer. Therefore, the stray capacitance of the data lines 65 tends to increase, and this obstructs the high speed operation of the memory device. Furthermore, in FIG. 5, since a plurality of data lines have to be laid with close mutual distances in a long area, the noise on the data lines 65 due to the parasitic capacitance effect between the data lines can ot be neglected for the stable operations of the device.

SUMMARY OF THE INVENTION

Accordingly, an object of the present invention is to provide a semiconductor memory device in which the stray capacitance is reduced by shortening the length of the control signal lines and the data lines so as to thereby achieve higher speed operation. Another object of the present invention is to provide a semiconductor memory device in which the parasitic capacitance effect is reduced by the layout of the data lines so as to thereby realize higher speed operation and stable operation.

The present invention may be briefly summarized as the memory cell array portion being separated into at least two portions on the substrate; and serial memories, such as shift registers, and control signal lines are collectively disposed between said memory cell arrays, and by this arrangement, the length of said control signal lines and data lines can be minimized so that the stray or parasitic capacitance is reduced, and as a result, a higher speed and stable operation of the semiconductor memory device is realized.

Other features and objects of the present invention will be apparent from the following description taken in connection with the accompanying drawings, in which:

DETAILED DESCRIPTION OF THE INVENTION

Figure 1:
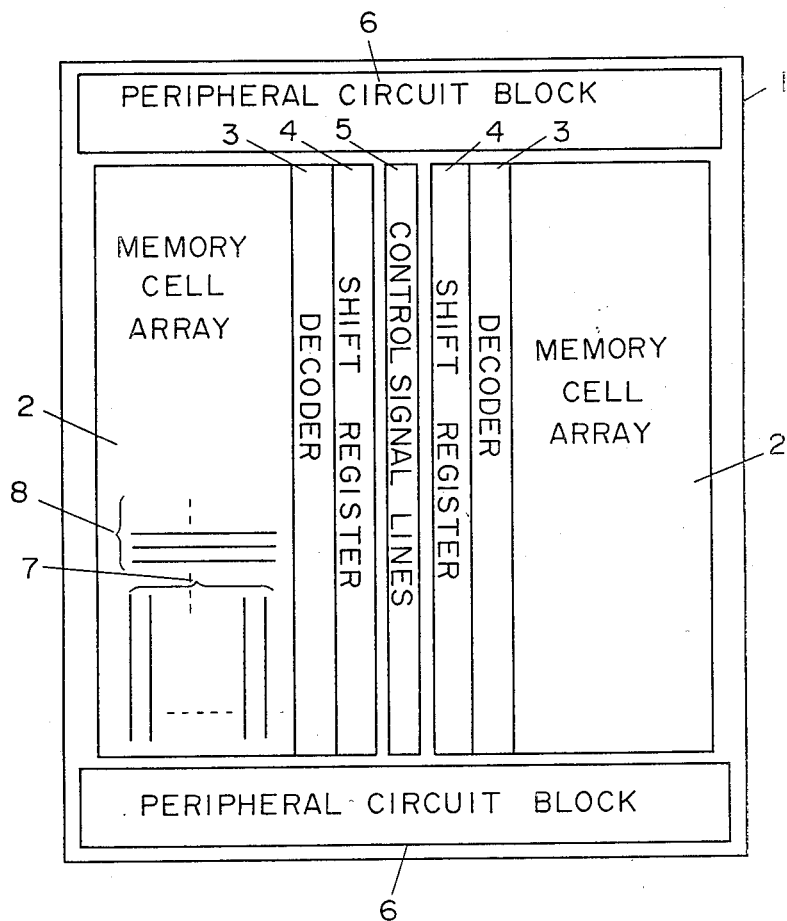
FIG. 1 shows a plane view of the essential parts of a semiconductor memory device according to the present invention.

In FIG. 1, the memory cell array is separated into two blocks 2,2 on the substrate 1. Each memory cell array 2 includes a plurality of bit lines 8 and a plurality of word lines 7 which perpendicularly cross said bit lines 8. By means of decoders 3,3, a particular bit line can be selected, and the data to be read-out or written is transferred between said bit line and the shift register 4. The data write or read-out to or from the memory cell arrays 2,2 and the data transfer to or from the shift register 4 are controlled by the control signal supplied from a plurality of control signal lines 5. The peripheral circuit blocks 6,6 include control signal generators and I/O circuits, and these peripheral circuit blocks 6,6 are disposed on both sides of said memory cell arrays 2,2 so that they are perpendicularly contiguous to the ends of said decoders 3,3, shift registeres 4,4 and a plurality of control signal lines 5.

Figure 2:
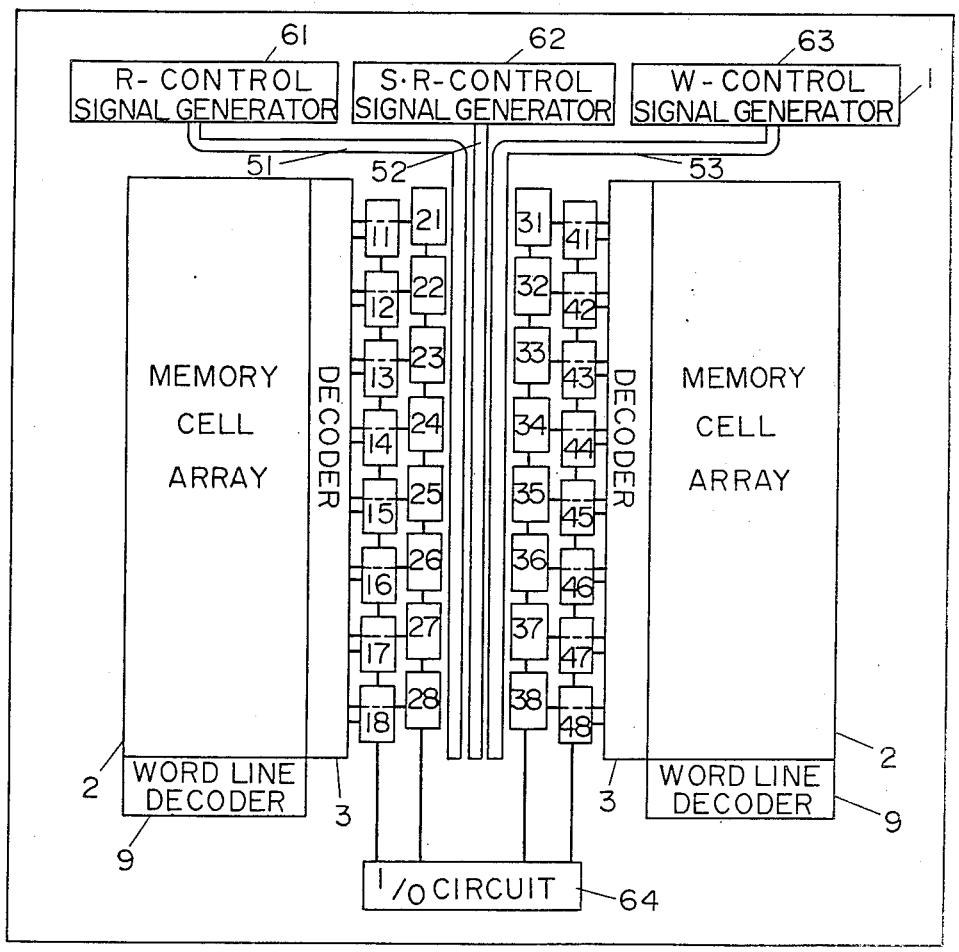
FIG. 2 shows a plane view of a more detailed construction of a semiconductor memory device according to the present invention.

FIG. 2 shows a more detailed circuit layout than that shown in FIG. 1. The device has a 4 bit input/output construction and has 4 series of 8 bit shift registers 11–18, 21–28, 31–38 and 41–48. Said shift registers are connected to I/O circuit 64 through the data lines. The data lines of each shift register are connected to the bit lines in the memory cell arrays 2,2 through the decoders 3,3. The read-out control signal generator 61, the shift register control signal generator 62 and the write control signal generator 63 generate requisite control signals, and these control signals are supplied to said shift registers 11-18, 21-28, 31-38 and 41-48 through control signal lines 51, 52 and 53. The word line decoders 9,9 are disposed on one side of said memory cell arrays 2,2.

Figure 4:
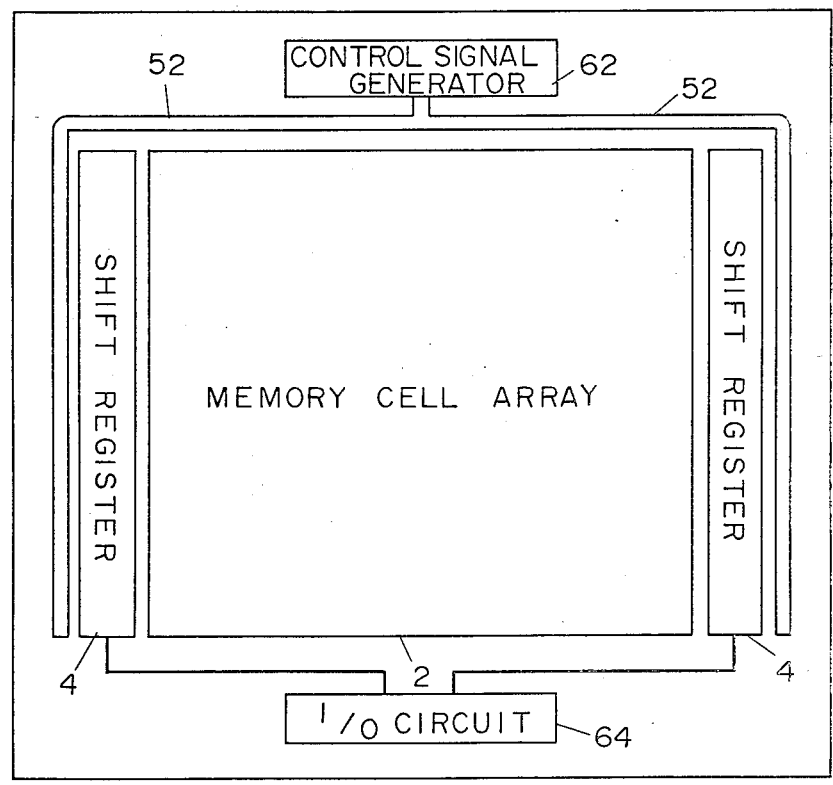
FIGS. 4 and 5 show a plane view of the essential parts of conventional semiconductor memory devices.
Figure 5:
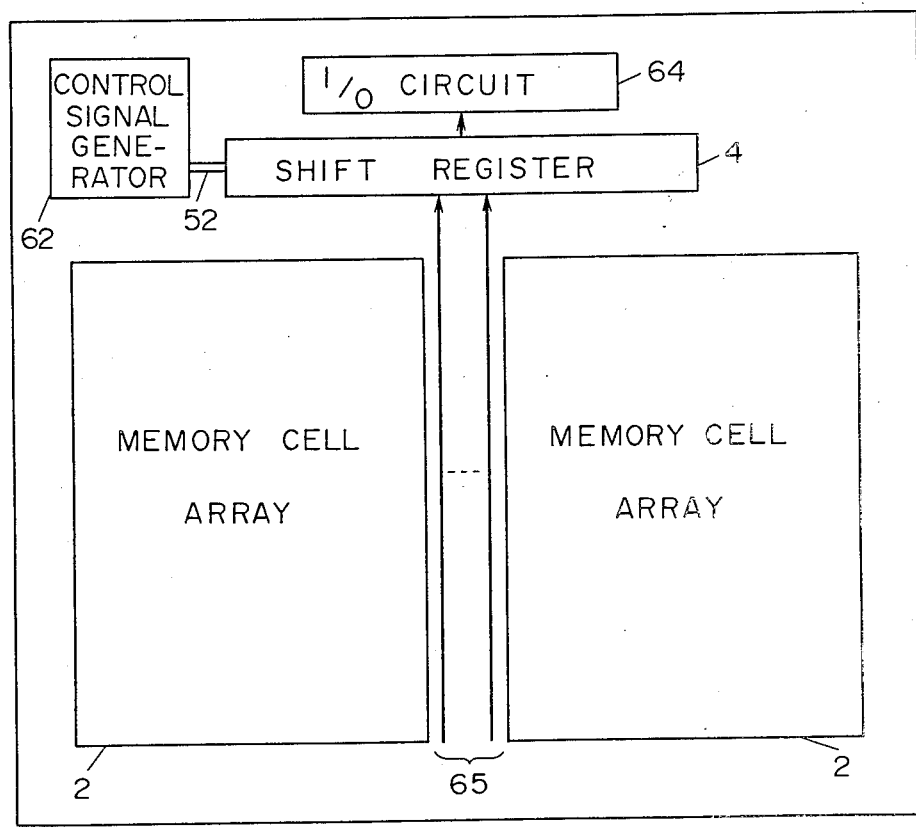

In the embodiments shown in FIGS. 1 and 2, the basic operations, such as data read-out and data write operations, are the same as explained hereinbefore in connection with FIGS. 4 and 5.

Figure 3:
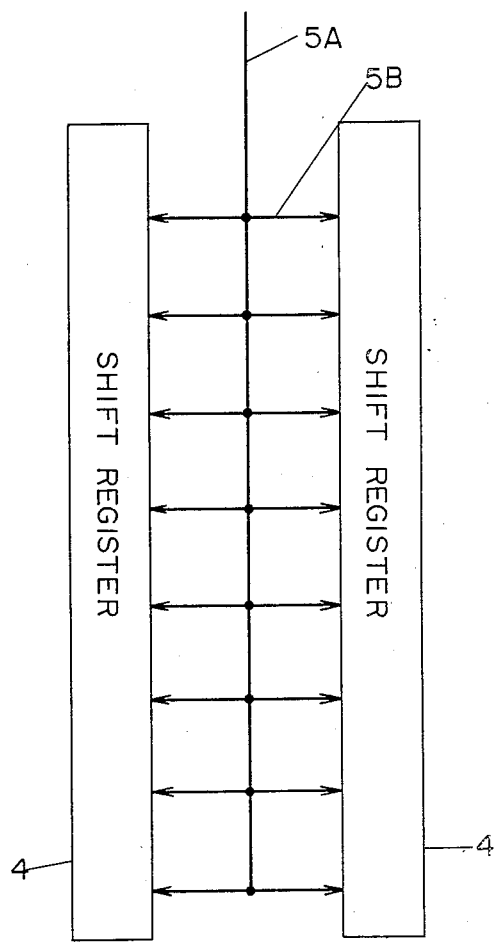
FIG. 3 shows an electrical connection of the control signal line of a semiconductor memory device according to the present invention.

In the above described circuit block layout, since the shift registers 11-18, 21-28, 31-38 and 41-48 are disposed in a single area between the two memory cell arrays 2,2, the control signal from the shift register control signal generator 62 can be transmitted to all shift registers 11-18, 21-28, 31-38 and 41-48 through the common control signal line 52. Therefore, unlike a conventional device shown in FIG. 4, the stray capacitance of the control signal line 52 can be considerably reduced. Therefore, the operation speed of the device becomes higher. Also, as to other control signal lines 51 and 53, the stray capacitance can be reduced for the same reason. As a result, the total operation speed of the device becomes much higher. Especially, as shown in FIG. 3, if the control signal line 51,52 or 53 is comprised of a common trunk line 5A connected to the generator 61, 62 or 63 and branch lines 5B which connect said trunk line 5A and shift registers etc., all of the shift registers are controlled by the control signal supplied from the common trunk line 5A, and therefore, the synchronization of all of the shift registers can also be improved. Furthermore, since shift registers 11-18, 21-28, 31-38 and 41-48 are close to the decoders 3,3, the length of the data lines can be minimized. Therefore, unlike the conventional device shown in FIG. 5, the parasitic capacitance effect can also be minimized, and the noise on the data lines can be reduced. As a result, the operations of the device becomes quite stable. A 4 bit construction is used in the preferred embodiment noted above and the shift registers used in them are 8 bit shift registers, but obviously other bit constructions or other types of shift register may be used. Therefore, while the invention has been described with reference to a particular embodiment, this description is not meant to be constructed in a limiting sense, but only illustrative of the principles involved.

What we claimed is:

1. A high speed and high stability layout for semiconductor memory device comprising at least following circuit block elements on a semiconductor substrate:
   at least two substantially rectangular memory cell arrays each having first sides and second sides orthogonally crossing each other, disposed on said semiconductor substrate such that said first sides of said at least two substantially rectangular memory cell arrays are faced mutually with a space therebetween, and having a plurality of memory cells arrayed in a matrix;
   at least two shift register means for writing data into said memory cells and reading out data from said memory cells, said at least two shift register means being individually disposed adjacent to said faced first sides of said at least two substantially rectangular memory cell arrays;
   control signal lines disposed between said at least two shift register means extending along said first sides of said at least two substantially rectangular memory cell arrays;
   a peripheral circuit means disposed along said second sides of said at least two substantially rectangular memory cell arrays for supplying said control signal lines with control signals; and
   an input and output circuit means for transferring data between said at least two shift register means and circuitry which is external to said semiconductor substrate;
   wherein said peripheral circuit means comprises: a write control signal generator, a read control signal generator, and a shift register control signal generator; and
   said control signal lines comprise: a write control signal line for supplying said at least two shift register means with write control signals from said write control signal generator so as to write the data stored in said at least two shift register means into said memory cells; a read control signal line for supplying said at least two shift register means with read control signals from said write control signal generator so as to read out the data stored in said memory cells into said at least two shift register means, nd a shift register control signal line for supplying said at least two shift register means with shift register control signals from said shift register control signal generator so as to transfer the data stored in each stage of said at least two shift register means sequentially.

2. A high speed and high stability layout for semiconductor memory device according to claim 1, wherein said write control signal line, read control signal line and shift register control signal line are composed of a common trunk line extending along said first sides of said at least two substantially rectangular memory cell arrays, and a plurality of branch lines for respectively coupling said trunk line and each stage of said shift register means.

* * * * *